United States Patent
Fung et al.

(10) Patent No.: US 7,370,291 B2
(45) Date of Patent: *May 6, 2008

(54) METHOD FOR MAPPING LOGIC DESIGN MEMORY INTO PHYSICAL MEMORY DEVICES OF A PROGRAMMABLE LOGIC DEVICE

(75) Inventors: Ryan Fung, Mississauga (CA); Ketan Padalia, Thornhill (CA)

(73) Assignee: Altera Corporation, San Jose, CA (US)

( * ) Notice: Subject to any disclaimer, the term of this patent is extended or adjusted under 35 U.S.C. 154(b) by 270 days.

This patent is subject to a terminal disclaimer.

(21) Appl. No.: 11/069,887

(22) Filed: Feb. 28, 2005

(65) Prior Publication Data

US 2005/0204325 A1    Sep. 15, 2005

Related U.S. Application Data

(63) Continuation of application No. 10/294,836, filed on Nov. 14, 2002, now Pat. No. 6,871,328.

(51) Int. Cl.
*G06F 17/50* (2006.01)

(52) U.S. Cl. ............... 716/1; 716/3; 716/7; 716/18

(58) Field of Classification Search .......... 716/1–3, 716/7–11, 16–18
See application file for complete search history.

(56) References Cited

U.S. PATENT DOCUMENTS

| | | | | |
|---|---|---|---|---|
| 5,819,065 A | * | 10/1998 | Chilton et al. | 703/24 |
| 6,209,123 B1 | * | 3/2001 | Maziasz et al. | 716/14 |
| 6,480,954 B2 | * | 11/2002 | Trimberger et al. | 713/1 |
| 6,520,559 B1 | * | 2/2003 | Steffens et al. | 296/100.09 |
| 6,636,935 B1 | * | 10/2003 | Ware et al. | 711/5 |
| 6,703,862 B1 | * | 3/2004 | Bilski | 326/46 |
| 6,779,169 B1 | * | 8/2004 | Singh et al. | 716/16 |
| 6,871,328 B1 | * | 3/2005 | Fung et al. | 716/1 |

* cited by examiner

*Primary Examiner*—Vuthe Siek
(74) *Attorney, Agent, or Firm*—Ropes & Gray LLP

(57) ABSTRACT

A method is provided for mapping logic design memory into physical memory devices of a programmable logic device. User constraints and physical constraints may be taken into account in generating the mapping solution. Functional block layout on the programmable logic device may be taken into account when generating the mapping solution. Multiple types of physical memory types may be considered and logic design memory may be mapped to those types of physical memory devices that are determined to be the most appropriate. A mapping solution may be optimized using, for example, simulated annealing.

66 Claims, 11 Drawing Sheets

METHOD FOR MAPPING LOGIC DESIGN MEMORY INTO PHYSICAL MEMORY DEVICES OF A PROGRAMMABLE LOGIC DEVICE

This application is a continuation of U.S. patent application Ser. No. 10/294,836, filed on Nov. 14, 2002now U.S. Pat No. 6,871,328, which is hereby incorporated by reference herein in its entirety.

BACKGROUND OF THE INVENTION

The present invention relates to implementing a user logic design in a programmable logic device, and more particularly, the present invention relates to implementing logic design memory in physical memory devices of a programmable logic device.

Programmable logic devices are well known. Early programmable logic devices were one-time configurable. For example, configuration may have been achieved by "blowing" (i.e., opening) fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations. At some point, such devices began to be provided with embedded blocks of random access memory that could be configured by the user to act as random access memory, read-only memory, or logic (such as P-TERM logic).

Programmable logic devices are becoming more sophisticated with respect to, for example, the types of physical memory devices that they provide. Whereas earlier programmable logic devices provided only a single type of physical memory device, current programmable logic devices may provide multiple options on a single chip. This offers users the flexibility of designing logic without the previous limitation of being restricted to implementing that logic using a single type of physical memory device.

While it may have been possible to program the earliest programmable logic devices manually, simply by determining mentally where various elements should be laid out, it was common even in connection with such earlier devices to provide programming software that allowed a user to lay out logic as desired and then translate that logic into programming for the programmable logic device. With current larger devices, it would be impractical to attempt to lay out the logic without such software.

Known techniques for implementing logic design memory into physical memory devices are limited with respect to several aspects. Known techniques do not take into account the possibility of having more than one type of physical memory device in a single programmable logic device. If, for example, a particular logic device has three or four different types of physical memory devices, each being suited for particular applications, it will typically be left to the user to manually make the determination of which logic design memory to implement in which type of physical memory device.

Another shortcoming of known techniques for implementing logic design memory in physical memory devices is the inability to guarantee that all location constraints will be met and the inability to prevent problems from arising due to conflicting constraints.

Yet another shortcoming of the known techniques is that typically the resultant physical devices are not optimized for efficiency in terms of resource usage, timing constraints, power demand, as well as other factors.

It would therefore be desirable to provide a way in which logic design memory is implemented in programmable logic devices taking into account the type of physical memory devices available in the programmable logic devices.

It would further be desirable to provide a way to optimize how logic design memory is implemented in physical memory devices.

SUMMARY OF THE INVENTION

In view of the foregoing, it is therefore an object of the present invention to provide a way in which to implement logic design memory in programmable logic devices taking into account the type of physical memory devices available in the programmable logic devices.

It is a further object of the present invention to provide a way to optimize how logic design memory is implemented in physical memory devices.

A logic design to hardware application is provided that implements a user logic design in a programmable logic design. The logic design to hardware application implements logic design memory defined in the user logic design in physical memory devices on the programmable logic device. The logic design to hardware application dynamically considers the target programmable logic device and may derive all corresponding constraints accordingly. All user constraints and physical constraints are taken into account when determining an implementation and any solution is guaranteed to satisfy all such constraints.

The logic design to hardware application may implement logic design memory in more than one type of physical memory device on the programmable logic device. The logic design to hardware application knows what the target programmable logic device is and may accordingly implement logic design memory in those types of physical memory devices found to be most suitable.

The logic design to hardware application, in implementing logic design memory in physical memory devices, may store, monitor, and update a representation of the target programmable logic device. The logic design to hardware application may initially map the logic design memory onto the physical memory devices of the representation of the target programmable logic device. The mapping may then be optimized by moving segments of the logic design memory between the physical memory devices. When an optimized solution is found, it is implemented in the programmable logic device. Because the logic design to hardware application has information regarding the target programmable logic device (i.e., via the representation), the physical layout, including layout of functional blocks, of the programmable logic device may be taken into account when generating the mapping and the optimization.

The logic design to hardware application generates memory slices from the logic design memory. The memory slices may be any suitable size and need not all be the same size. The memory slices are grouped into one or more compatible logic groups, where the memory slices of each compatible logic group have substantially the same control signals.

The memory slices of each compatible logic group are grouped into one or more constraint sub-group, where the memory slices of each constraint sub-group share substantially the same constraints. The memory slices of each constraint sub-group are grouped into one or more cliques, where the memory slices of each clique are constrained to be implemented in the same physical memory device.

The constraint sub-groups and cliques of each compatible logic group are sorted according to appropriate parameters, criteria, or both. The logic design to hardware application identifies a highest priority compatible logic group, the memory slices of which will be mapped next. These memory slices are mapped to the extent possible (according to the sorting order determined for each constraint sub-group and clique). The next highest priority compatible logic group is then identified and the associated memory slices are mapped. This continues until either all memory slices of the user logic design are mapped or until a failure is encountered.

If a failure is encountered, then information regarding the failure may be recorded and the constraint sub-groups may be re-sorted based, at least in part, on the information regarding the failure. Mapping then resumes based on the new sorting. If too many failures occur (e.g., consecutively), then the entire mapping operation may be deemed to have failed.

If the mapping of all memory slices is successful, the logic design to hardware application may optimize this mapping solution by, for example, performing a simulated annealing process in which memory slices are moved between physical memory devices in search of a more efficient solution.

The resultant mapping from the optimization may then be implemented in the programmable logic device by placing and routing the memory blocks, corresponding to the mapped memory slices, in the physical circuit.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
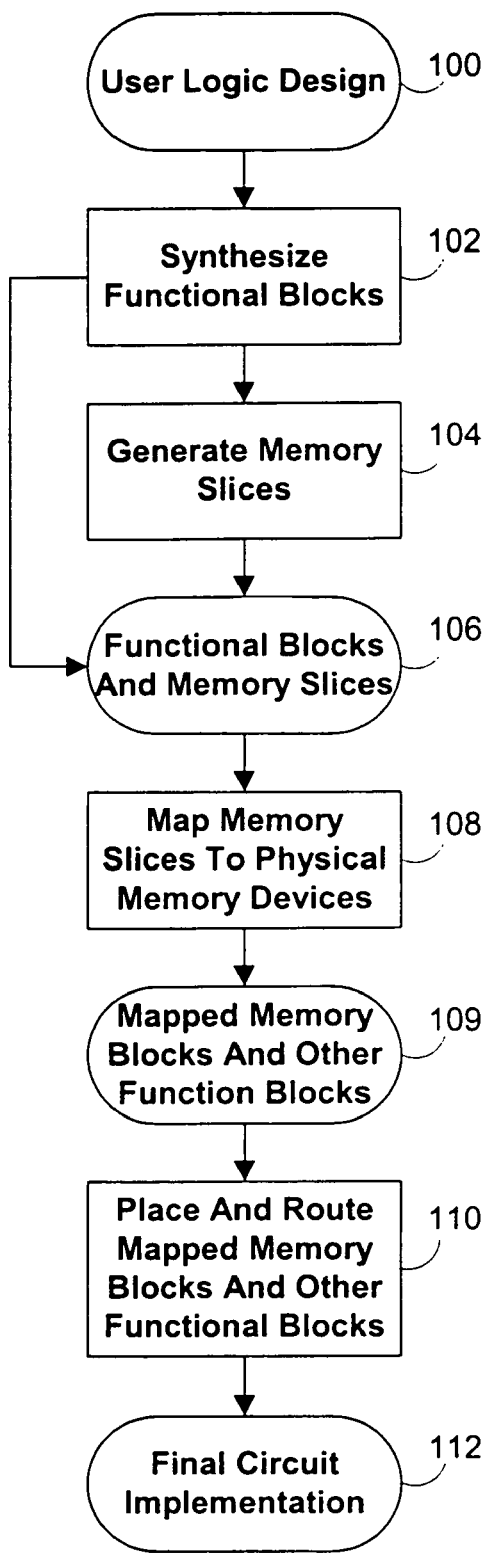
FIG. 1 is a flow-chart of illustrative steps involved in implementing a circuit in a programmable logic device from a user logic design in accordance with one embodiment of the present invention.

The present invention maps logic design memory (as defined by a user-created logic design) into physical memory devices located on a programmable logic device. Logic design memory may include any suitable form of memory that may be used in a user logic design, such as any suitable type of random access memory. Physical memory devices may include any suitable memory device that may be used to implement logic design memory, such as any form of physical random access memory, EPROM, logic array blocks implemented as memory devices, or any other suitable physical element or elements of a programmable logic device. The physical memory devices of a programmable logic device may vary according to any suitable specification, such as capacity, speed, structure, size, or any other suitable specification.

The present invention is primarily described herein in terms of a logic design to hardware application. The logic design to hardware application may be any suitable software, hardware, or both used to implement the features of the present invention. Such a logic design to hardware application may be of the type that is typically provided as a design tool by the manufacturer of the programmable logic device. For example, the method of the present invention may be incorporated into the QUARTUS® II programming tool software available from Altera Corporation, of San Jose, Calif. As such, the method of the present invention includes the ability to read a description, provided to the logic design to hardware application, of the physical parameters of a particular programmable logic device on which a logic design is to be implemented, and to take into account the physical constraints of that particular programmable logic device, without the method of the invention itself being limited to any particular programmable logic device.

The logic design to hardware application of the present invention includes the capability to implement memory elements from user logic designs into physical memory devices on the programmable logic device. For example, taking into account the type of programmable logic device being implemented onto, the logic design to hardware implements the logic design memory in physical memory devices by "slicing" the logic design memory into smaller pieces and distributing the resultant "memory slices" to particular physical memory devices at particular locations on the programmable logic device. The determination of which type of memory device and at which location to implement each memory slice is made in an effort to optimize the physical configuration. This optimization may be made based on any suitable factors, such as user-defined constraints, physical limitation of the target programmable logic device, logic placement and routing of functional elements, any other suitable criterion, or any combination thereof.

The logic design to hardware application, in determining the mapping of logic design memory into physical memory devices, creates a preliminary mapping based on information about the target programmable logic device. In effect, the logic design to hardware application creates a representation of the target programmable logic device having physical memory devices to which logic design memory is mapped. The logic design to hardware application may store, monitor, and update the representation of the programmable logic device in accordance with the present invention.

Because the logic design to hardware application generates a mapping of logic design memory to physical memory devices based on this representation of the actual target programmable logic device, the logic design to hardware application may take into account more than one type of physical memory device that resides on the programmable logic device. Accordingly, the different physical constraints and characteristics of the different physical memory devices and their layout on the particular target programmable logic device may be one of the factors in determining the feasibility of a particular mapping. Other factors may include constraints defined by the user, and the layout of all other elements, such as logic array blocks, throughout the programmable logic device (e.g., in anticipation of routing).

Such information may also be used by the logic design to hardware application for optimization purposes.

In one suitable approach, the logic design to hardware application may first perform a greedy, feasibility-driven analysis to implement the logic design memory in available physical memory devices of the target programmable logic device in view of physical constraints of the physical memory devices (e.g., capacity), user constraints, and other such constraints. User constraints may include, for example, region constraints and floating region constraints (i.e., specifying regions or relative locations within the programmable logic device to implement particular logic design memory), memory slice cliques (i.e., groups of memory slices that must be kept together), physical memory device type constraints (e.g., user specifies the particular physical memory device type to use), or any other suitable constraint. It is feasibility-driven because the analysis involved may, for the most part, be directed towards obtaining a solution that satisfies all constraints. The solution need not be optimized.

A floating region is a constraint that restricts particular memory slices to be implemented in a region having particular contents (e.g., functional blocks). The floating region may be allowed to be implemented anywhere on the programmable logic device or within certain boundaries of the programmable logic device. For example, its lower-left corner may be placed at a fixed location on the programmable logic device or the floating region may be placed anywhere on the programmable logic device. The floating region may have a fixed size, shape, or both. Alternatively, the floating region may have no fixed size, shape, or both. Floating regions may be nested, with floating regions having other floating regions within one another (e.g., in a hierarchical structure). The floating region may include contents that are free to move inside the floating region. Alternatively, the locations of the floating region's contents may be specified relative to, for example, the lower-left corner of the floating region. Floating regions are further discussed in commonly assigned U.S. patent application Ser. No. 10/160,474, filed May 31, 2002, and in commonly assigned U.S. patent application Ser. No. 10/194,199, filed Jul. 12, 2002, both of which are hereby incorporated by reference herein in their entireties.

This feasibility-driven solution may then be modified as a result of an optimization analysis. During optimization, the logic design to hardware application may redistribute memory slices between the physical memory devices to which they were assigned. The focus is, preferably, to gather related logic together, balance the use of each physical memory device, optimize timing, and consolidate memory slices that are part of the same floating region (i.e., to minimize the number of separate physical memory devices in the floating region and excluding from the floating region memory slices that are not constrained to the floating region). One suitable optimization scheme may be based on simulated annealing.

In another suitable approach, the optimization stage may be carried out together with the feasibility analysis in a single process.

It will be understood that the feasibility-driven mapping of logic design memory to physical memory devices and the optimization analysis and modifications preferably take place using the representation of the target programmable logic device that is stored and updated by the logic design to hardware application. Substantially all mapping and modifications preferably take place on this representation to allow for further changes to be made more conveniently. When the logic design to hardware application determines that a final solution has been established, then the actual implementation of the circuit may take place on the target programmable logic device using any suitable placement and routing techniques. For example, during the placement stage, the logic design to hardware application may be able to move groups of memory slices among the types of physical memory devices to which they may have respectively been assigned during the mapping stage, constraints permitting.

The logic design to hardware application defers making decisions regarding how logic design memory is to be mapped to the physical memory devices of the target programmable logic device relative to, for example, synthesizing logic blocks, learning constraints, and the like.

Logic elements are examples of elements that may be synthesized early in the user logic design to programmable logic device mapping process. That is, user logic gates are grouped and mapped into logic elements for placement in a programmable logic device.

By deferring the decision for logic design memory, several advantages may be gained. For example, user placement constraints may be better considered (i.e., because if mapping of logic design memory to physical memory device types occurs when logic block synthesis is typically performed, user placement constraints may not be effectively considered because the target programmable logic device is not known at that point); physical characteristics and layout, as well as compatibility characteristics of the target programmable logic device may be considered (e.g., quantities and positions of different types of physical memory devices); and logic element placement on the programmable logic device may be better leveraged.

In another embodiment of the present invention, the logic design to hardware application may make hard decisions (i.e., irreversible decisions) relatively early. These decisions include, for example, which logic design memory elements and portions thereof should be grouped, which type of physical memory device each grouping should target, and any other suitable decisions.

Whether or not to defer logic device memory mapping may be dependent on any suitable circumstances. For purposes of brevity and clarity, the present invention is primarily described in terms of a deferred logic design memory mapping decision approach.

FIG. 1 is a flow-chart of illustrative steps involved in implementing a circuit in a programmable logic device from a user logic design in accordance with one embodiment of the present invention. FIG. 1 shows, generally, how, using the logic design to hardware application of the present invention, a user logic design circuit 100 is transformed into a final circuit implementation 112 on the programmable logic device.

At step 102, the logic design to hardware application synthesizes functional blocks. A functional block is a cluster of circuitry that produces certain outputs. The outputs may or may not depend on zero or more inputs (e.g., function generators produce an output but require potentially no inputs, other than power). The outputs may or may not be a function of the sequence of inputs over time (e.g., memory as opposed to combinational logic). It will be understood that combinational logic has no state or memory. The term "functional blocks" may mean physical functional blocks when referring to elements on the programmable logic device. This term may also imply logical functional blocks (e.g., as defined in a user logic design) when referring to the elements that may be implemented in the physical functional blocks. Functional blocks may include, for example, logic elements, multiplication and addition circuit ("MAC") elements, memory blocks, any other suitable elements, or any combination thereof.

At step 104, the logic design to hardware application generates memory slices from the logic design memory. Memory slices are portions of logic design memory that may be combined and implemented in physical memory devices. FIGS. 2-6 illustrate one way in which memory slices may be generated and may be implemented in physical memory devices.

Figure 2:
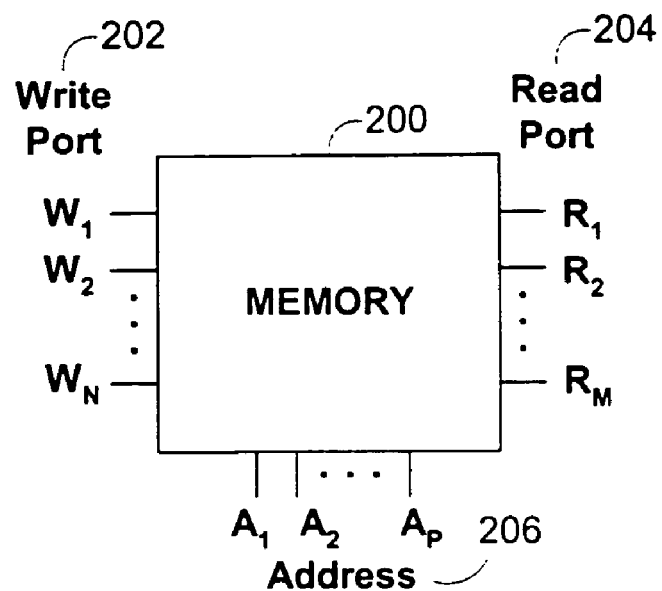
FIG. 2 is a schematic diagram of a general logic design memory.
Figure 3:
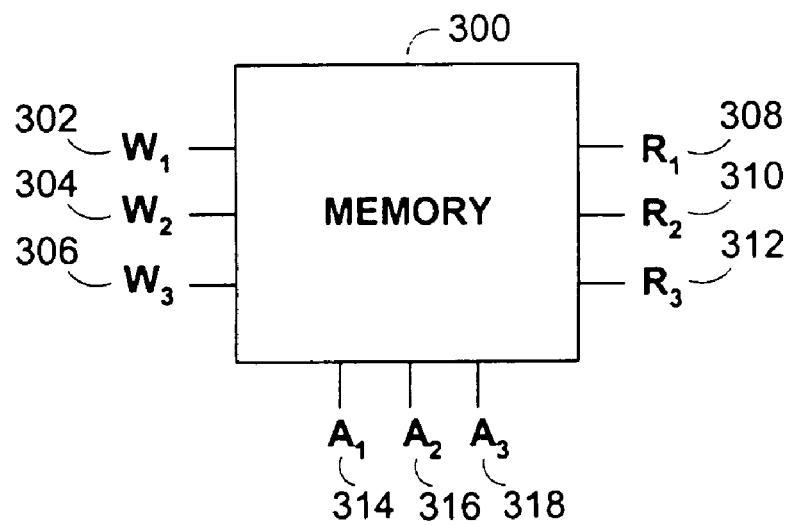
FIG. 3 is a schematic diagram of an illustrative logic design memory.

FIG. 2 is a schematic diagram of a typical logic design memory 200. Logic design memory 200 may have an N-input write port 202 and an M-input read port 204. P-input address port 206 may be used to access particular bits stored in logic design memory 200 (i.e., a P-input address port will access up to 2^P memory locations). It will be understood that when N is not equal to M, there will be at least two address ports. Because the total number of bits stored is (data width*2^(address width)), and because the total number of bits accessible in the memory is the same, if one data port is smaller, the address port must be wider. FIG. 3 is a schematic diagram of a logic design memory 300 in which N=M=P=3 for purposes of clarity and brevity. Write pins 302, 304, and 306 correspond to read pins 308, 310, and 312, respectively. For example, for a particular address defined using address pins 314, 316, and 318, write pin 302 will write to the same location from which read pin 308 will read. Likewise, for a particular address defined using address pins 314, 316, and 318, write pins 304 and 306 will write to the same respective locations from which read pins 310 and 312 will read.

Figure 4:
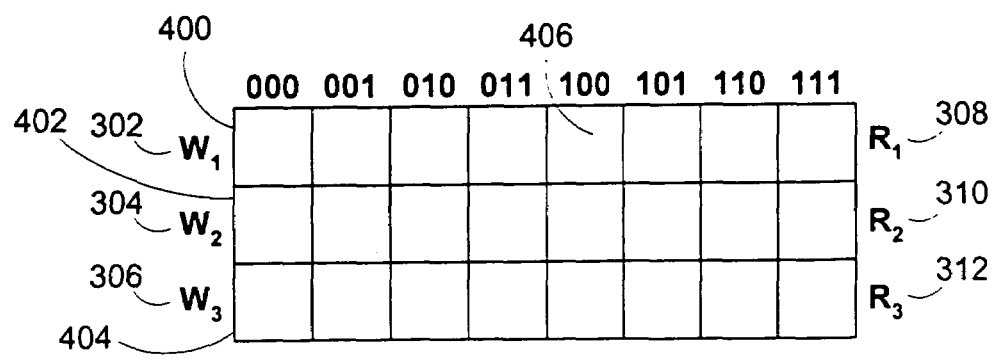
FIG. 4 is a diagram representing an illustrative arrangement of the logic design memory of FIG. 3 in accordance with one embodiment of the present invention.

FIG. 4 is a diagram representing an arrangement of logic design memory 300 of FIG. 3 in accordance with one embodiment of the present invention. FIG. 4 illustrates how write pins 302, 304, and 306 correspond with read pins 308, 310, and 312, respectively. For example, row 400 of address locations between write pin 302 and read pin 308 is accessible only via write pin 302 (to write data into one of the memory locations along row 400) and read pin 308 (to read data from one of the memory locations along row 400). Likewise, row 402 of memory locations is accessible to write pin 304 and read pin 310, and row 404 of memory locations is accessible to write pin 306 and read pin 312. Thus, each write pin and corresponding read pin provide access to memory locations that are addressable using the address pins.

In view of these characteristics of logic design memory, it would be preferable to "slice" logic design memory into slices of the form of rows, such as rows 400, 402, and 404 of FIG. 4, whereby each memory slice contains memory locations that are addressable using the address pins of the logic design memory, and whereby, in the most fundamental form, each memory slice has a single write pin and a single corresponding read pin.

Figure 5:
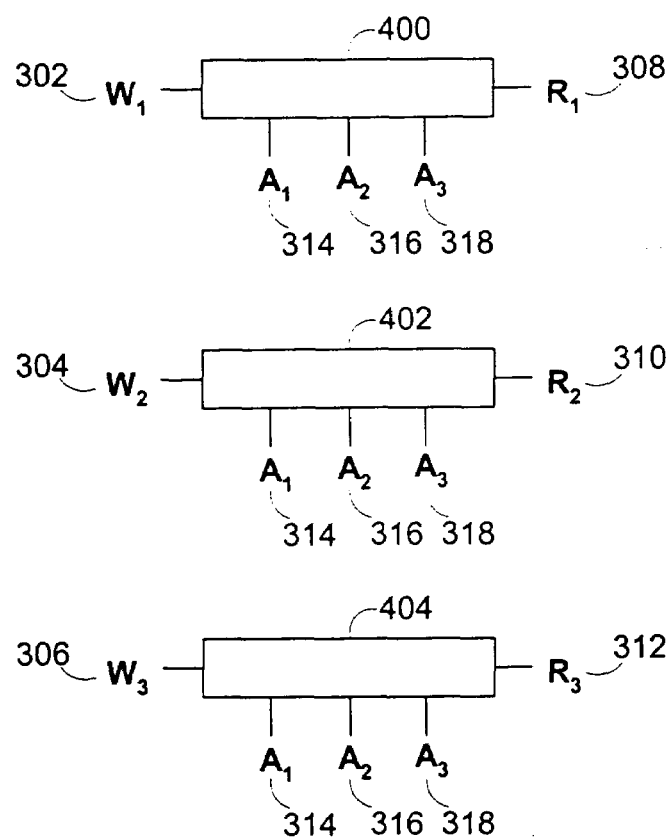
FIG. 5 is a schematic diagram of illustrative memory slices generated from the logic design memory of FIG. 3 in accordance with one embodiment of the present invention.

FIG. 5 is a schematic diagram of illustrative memory slices generated from the logic design memory of FIG. 3 in accordance with one embodiment of the present invention. Row 400, having write pin 302 and read pin 308, with address pins 314, 316, and 318 make up one memory slice. Likewise, row 402 with write pin 304, read pin 310, and address pins 314, 316, and 318 make up another memory slice. Row 404 with write pin 306, read pin 312, and address pins 314, 316, and 318 make up another memory slice.

It will be understood that the memory slices of FIG. 5 are merely illustrative. Any other suitable arrangement may be used for generating memory slices. For example, memory slices may be based on columns of memory locations (with reference to the perspective of FIG. 4), whereby each address is associated with three pairings of read pins and write pins. Memory slices may be generated having more than one row of memory locations (e.g., rows 400 and 402 may be combined to form a single memory slice having two pairs of read pins and write pins). In this sense, memory slices may be made up of other memory slices.

In one suitable approach, memory slices may be generated by aggregating memory locations having any suitable relationship (e.g., common control signals, access routes, or any other suitable relationship). For purposes of clarity and brevity, and not by way of limitation, the present invention is described herein primarily in terms of memory slices of the form illustrated in FIG. 5. It will be understood that any other suitable form of memory slice may be used, based on, for example, particular applications, type of programmable logic device, any other suitable criterion, or any combination thereof.

Referring back to FIG. 1, at step 104 the generated memory slices are preferably "minimum width" memory slices, meaning that the memory slices have a minimum number of rows. It will be understood that the width of the memory slices are subject to user constraints. User constraints may include, for example, constraints that are automatically generated during the mapping of the user logic design to the programmable logic device.

In one suitable approach, memory slices may be generated (step 104) prior to synthesizing functional blocks (step 102).

Having completed the generation of memory slices at step 104 and the synthesis of functional blocks at step 102, a netlist 106 of functional blocks and memory slices may be made available to the logic design to hardware application.

At step 108, the logic design to hardware application maps the memory slices (from functional blocks and memory slices 104) to physical memory devices. During this phase, the logic design to hardware application generates memory blocks, which are groupings of memory slices each targeted to a particular physical memory device type in the programmable logic device. During step 108, the logic design to hardware application considers the availability of physical memory devices of each physical memory device type, user location assignments and constraints, and the capacity and functionality of each of the physical memory devices when making the logic design memory slice assignments. Step 108 is further discussed below with reference to FIGS. 6-13.

At step 110, the logic design to hardware application places and routes the mapped memory blocks and other functional blocks 109 to produce final circuit implementation 112. Any other suitable operations to implement user logic design 100 in the programmable logic device may take place at step 110 (or at any other appropriate time).

Figure 6:
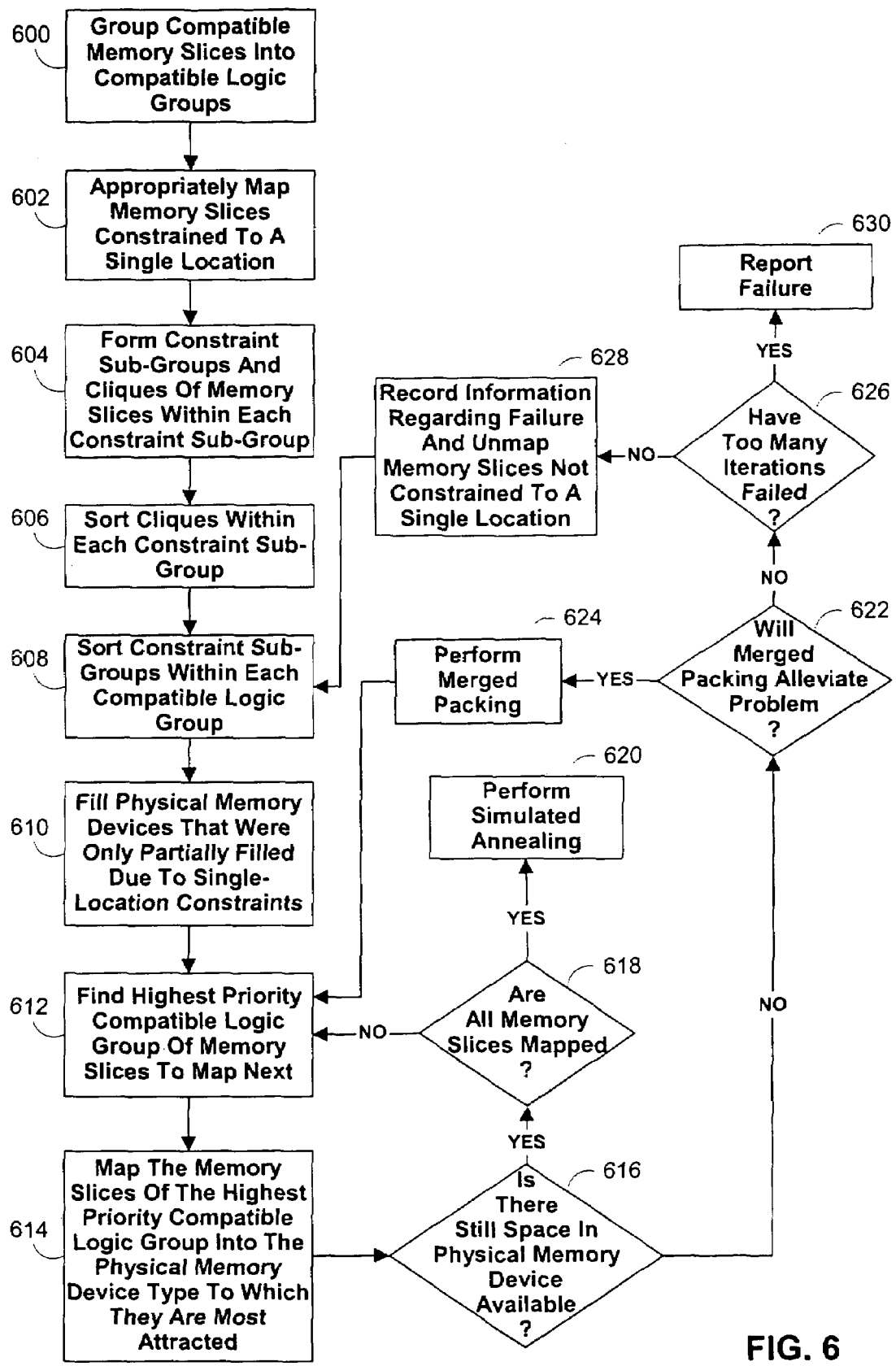
FIG. 6 is a flow-chart of illustrative steps involved in mapping logic design memory to physical memory devices on a programmable logic device in accordance with one embodiment of the present invention.
Figure 7:
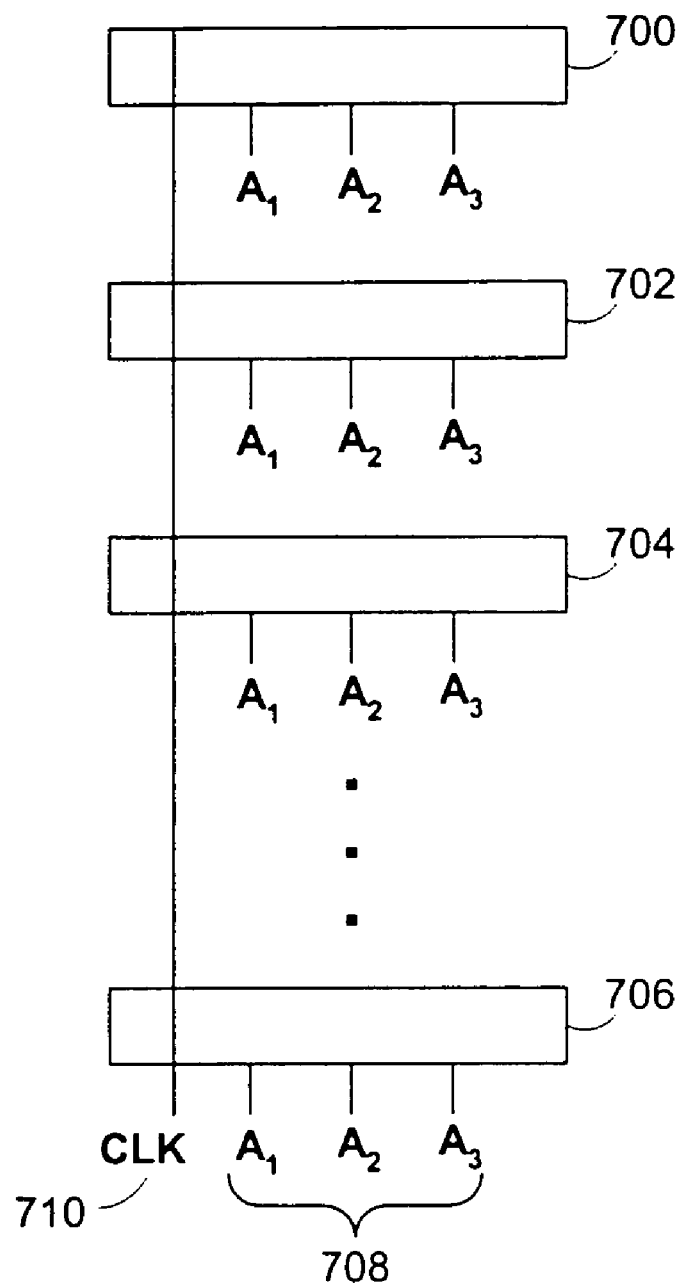
FIG. 7 is a schematic diagram of some illustrative memory slices that may be included in a compatible logic group in accordance with one embodiment of the present invention.

FIG. 6 is a flow-chart of illustrative steps involved in mapping logic design memory to physical memory devices on a programmable logic device in accordance with one embodiment of the present invention. At step 600, the logic design to hardware application identifies groups of compatible memory slices (from slices 106 of FIG. 1) into compatible logic groups. A compatible logic group contains memory slices with the same address lines and control signals. FIG. 7 is a schematic diagram of some illustrative memory slices that may be included in a compatible logic group in accordance with one embodiment of the present invention. Memory slices 700, 702, 704, and 706 all share the same clock signal 710, and the same address lines 708. Therefore, according to the present invention, memory slices 700, 702, 704, and 706 may be grouped into a compatible logic group.

Memory slices of the same compatible logic group may be placed together in the same physical memory device. This is because the memory slices of a compatible logic group are effectively different memory slices of a larger logic design memory.

Preferably, the logic design to hardware application sliced the logic design memory into the smallest memory slices possible (i.e., minimum width), at for example, step 104 of FIG. 1. For example, single-port logic design memory may be sliced down to memory slices having one write pin and one read pin. Logic design memory having mixed width structures may also be sliced into memory slices of small width. For example, a logic design memory with 16 write pins and four read pins may be sliced down to memory slices having four write pins and one read pin.

Byte-enables and other constraints may affect the sizes of the memory slices upon which the logic design to hardware application operates in the mapping step of FIG. 6. Nevertheless, the logic design to hardware application may be given the ability to handle combinations of all memory slice sizes. It will be understood that, generally, the smaller the memory slices, the more freedom the logic design to hardware application has to make better optimization decisions.

At step 602, memory slices, which are locked down or constrained to be placed in a single physical memory device, are appropriately mapped. There is no optimization decision regarding these memory slices because the physical memory device assignment is already made through the constraint.

At step 604, the memory slices within each compatible logic group may be further grouped into constraint sub-groups. Each constraint sub-group includes memory slices that have substantially identical constraints. Constraints may include limiting particular memory slices to be implemented in a particular region of the target programmable logic device (including a chip-wide region representing no constraint), type of physical memory device, any other suitable constraint, or any combination thereof. Ignoring size, all memory slices in the particular constraint sub-group look identical to the logic design to hardware application in the sense that, if one of them is placed in a particular physical memory device, any of the other memory slices from the same constraint sub-group may have also been placed in that same physical memory device.

Also at step 604, the logic design to hardware application further groups the memory slices within each constraint sub-group into cliques. All of the memory slices within a clique are constrained to be placed within the same physical memory device. This is independent of the region constraints, physical memory device type constraints, or other constraints considered for the constraint sub-groups. When a physical memory device is selected for a given memory slice in a clique that satisfies the memory slice's sub-group constraints, all the memory slices in the clique with which that memory slice is associated are to be placed in the selected physical memory device.

Figure 8:
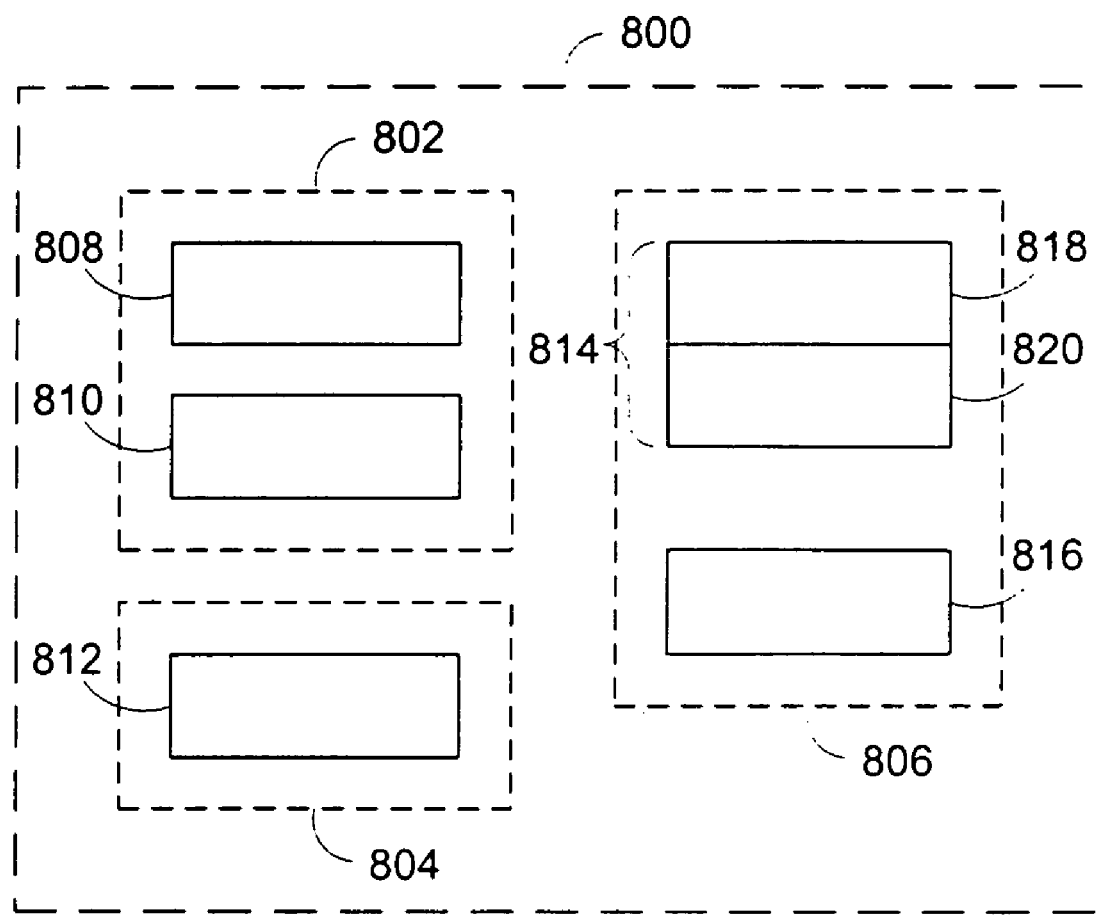
FIG. 8 is a schematic diagram illustrating the relationship between an illustrative compatible logic group, an illustrative constraint sub-group, and an illustrative clique in accordance with one embodiment of the present invention.

FIG. 8 illustrates the relationship between a compatible logic group, a constraint sub-group, and a clique. FIG. 8 is a schematic diagram of an illustrative compatible logic group 800 having constraint sub-groups 802, 804, and 806. Memory slices 808, 810, 812, and 816 each belong to distinct cliques that includes only a single memory slice. Memory slices 818 and 820 form clique 814. FIG. 8 is shown merely for illustrative purposes. It will be apparent that any suitable arrangement may be used by the logic design to hardware application in grouping memory slices based on any suitable criteria.

Referring back to FIG. 6, at step 606, the logic design to hardware application may sort the cliques within each constraint sub-group in order of decreasing clique size. If two cliques are the same size, the tie may be broken by selecting cliques that have a fixed offset within a floating region to come before other cliques.

If a tie still remains, then the logic design to hardware application may sort the tied cliques arbitrarily. This sorting order determines the priority of mapping within the constraint sub-group (i.e., larger cliques are mapped before smaller cliques).

At step 608, the logic design to hardware application may sort constraint sub-groups within each compatible logic group. Any suitable parameters may be used in determining sorting criteria. For example, a constraint sub-group may be sorted based on the degree of difficulty of mapping its largest size clique to physical memory devices.

Figure 9:
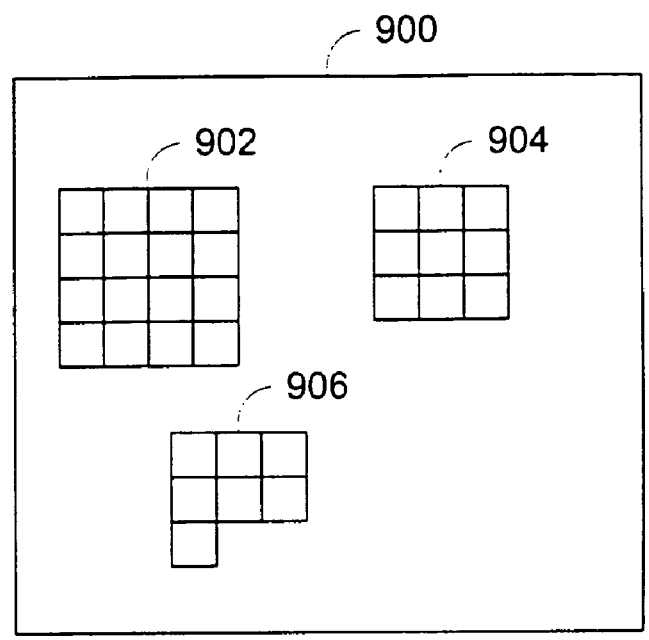
FIG. 9 is a schematic diagram of illustrative physical memory devices and an illustrative constraint sub-group in accordance with one embodiment of the present invention.
Figure 9:
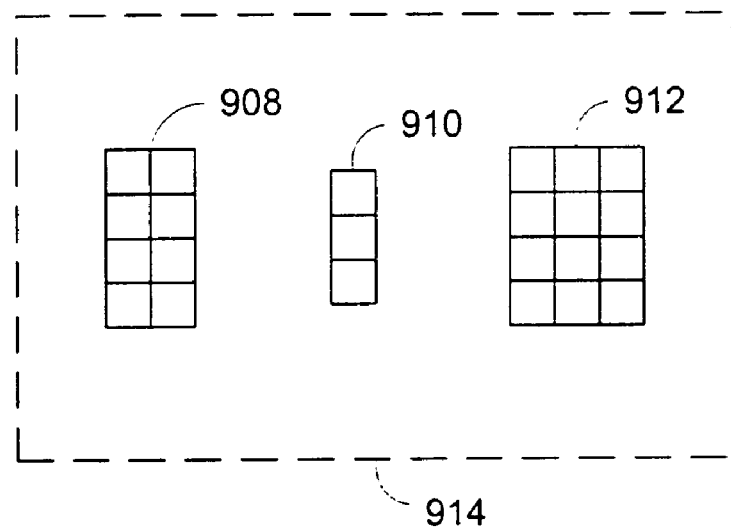

In one suitable approach, a metric based at least in part on the number of cliques of the largest clique size within the sub-group that may theoretically be mapped (i.e., made to fit) in all physical memory device locations available to the constraint sub-group may be used. For example, as illustrated in FIG. 9, the clique of largest size (i.e., based on number of memory slices) in constraint sub-group 914 is clique 912 with a size of 12. The number of times clique 912, having 12 memory slices, may be mapped onto physical memory devices 902, 904, and 906 of programmable logic device 900 is one (i.e., once in physical memory device 902, having a capacity of 16 memory slices). If, for example, clique 908 of size eight were the clique of largest size in constraint sub-group 914, then the number of times the largest clique may be mapped is three (i.e., mapped twice in physical memory device 902 and once in physical memory device 904).

In addition to this value, the metric may further be based in part on the number of cliques of the largest clique size in the constraint sub-group. For example, with reference to FIG. 9, because the largest clique size within constraint sub-group 914 is 12, and because there is only one clique that is of this size, the number of cliques of the largest clique size is one. In addition, the number of times mapping failed may be used to sort constraint sub-groups.

One such suitable metric that may be used to sort constraint sub-groups is the following:

$$\text{num\_largest\_cliques\_mappable}/\text{num\_largest\_cliques}/ \quad (1)$$
$$(\text{num\_times\_sub\_group\_mapping\_failed}+1)\wedge 2$$

where num_largest_cliques_mappable is the number of cliques of the largest clique size within the constraint sub-group that may theoretically be mapped to all physical memory device locations available to the constraint sub-group. num_largest_cliques is the number of cliques of the largest clique size in the constraint sub-group. num_times_sub_group_mapping_failed may be used to move those constraint sub-groups that have been unable to be mapped in previous iterations closer to the front of the line for the current mapping iteration. This metric is merely illustrative. Any other suitable metric value or any other suitable criteria may be used for sorting constraint sub-groups.

The constraint sub-groups may be sorted in order of increasing metric value. To break ties in this metric value, constraint sub-groups that include memory slices of a floating region are prioritized. To break ties among these constraint sub-groups, those constraint sub-groups having deeper floating regions in the hierarchy (i.e., floating regions within the most number of floating regions) are prioritized.

This metric for sorting constraint sub-groups is merely illustrative. Any other suitable parameters, criteria, or both may be used in sorting constraint sub-groups.

At step 610, the logic design to hardware application fills, to the extent possible, those physical memory devices that have been partially filled because of constraints to a single memory device location with memory slices from respective compatible logic groups. The logic design to hardware application may select the memory slices used to fill the physical memory devices according to the priority ordering determined at steps 606 and 608 (i.e., from the highest priority clique of the highest priority constraint sub-group).

At step 612, the remaining compatible logic groups, the memory slices of which have not yet been mapped to a physical memory device, are examined to find the highest priority compatible logic group. The memory slices of the highest priority compatible logic group will be mapped first. To aid in ensuring that all logic design memory is mapped to physical memory devices, that all user constraints are satisfied, and to create a high-quality mapping of memory slices to the different types of physical memory devices on the programmable logic device, the logic design to hardware application may consider all compatible logic groups (i.e., that have memory slices that have not yet been mapped) substantially simultaneously.

This may by facilitated by computing a prioritization value for each compatible logic group. The prioritization value may be based on any suitable parameters, criteria, or both. For example, such criteria and parameters may include the largest clique size of the highest priority constraint sub-group of each compatible logic group, the number of times the largest clique of the highest priority constraint sub-group may theoretically be mapped to the available physical memory devices, the number of times the highest priority constraint sub-group failed to be mapped in previous iterations, the level of attraction between a compatible logic group and a particular physical memory device, any other suitable criterion or parameter, or any combination thereof.

In one suitable approach, the logic design to hardware application may compute two gain values that may be added to produce a prioritization value for each compatible logic group.

A first gain value may be computed based on the highest priority constraint sub-group of each logic design memory that has memory slices remaining to be mapped to physical memory devices. The first gain value may be, for example:

$$\text{num\_cliques\_of\_largest\_unmapped\_clique\_size\_in\_sub\_group}* \quad (2)$$
$$(\text{num\_times\_sub\_group\_mapping\_failed}+1)\wedge 2/$$
$$\text{num\_cliques\_of\_largest\_unmapped\_size\_mappable}$$

where num_cliques_of_largest_unmapped_clique_size_in_sub_group is the number of cliques of largest size in the highest priority constraint sub-group that has not yet been mapped. num_cliques_of_largest_unmapped_size_mappable is the number of cliques of largest size of the highest priority constraint sub-group that may be mapped to the space available in physical memory devices to that constraint sub-group (i.e., those free physical memory devices that satisfy the constraints associated with the highest priority constraint sub-group).

Because this first gain value calculation is in a time-critical loop, the component values of this first gain are computed incrementally and are computed anew when incremental update is not possible or too costly (e.g., in terms of time, memory space, etc.). The logic design to hardware application may employ incremental updates for any other costs or gain calculations in time critical loops whenever possible and not too costly.

The logic design to hardware application may compute a second gain value based on a compatible logic group's attraction to each physical memory device type. The second gain value may be designed to measure how much the memory slices of a compatible logic group are attracted to a particular physical memory device type as a potential target. The attraction of the memory slices of the compatible logic group to a physical memory device type may be quantified as:

$$\text{physical\_memory\_device\_type\_attraction}= \quad (3)$$
$$(-1)*\text{total\_space\_occupied\_by\_memory\_slices\_left\_to\_map}/$$

```
              -continued
space_available_in_physical_memory_device_of_type* cost_of_physical_memory_device_type
``` where cost_of_physical_memory_device_type is set to be inversely proportional to how often the physical memory device type occurs in the device. It will be understood that even though different logic design memory elements may perceive a different amount of space available in a particular physical memory device (e.g., because of different control signals for each logic design memory), the attraction is quantified using the ratio of space needed to space available in the particular physical memory device type (i.e., not the absolute values).

The second gain value may be, for example:

$$\begin{aligned}&(\text{greatest\_physical\_memory\_device\_type\_attraction} - \\ &\quad \text{second\_greatest\_physical\_memory\_device\_type\_attraction})/ \\ &\quad \text{abs}(\text{second\_greatest\_physical\_memory\_device\_type\_attraction}) * \\ &\quad \text{MULTIPLIER}\end{aligned} \quad (4)$$

Both greatest_physical_memory_device_type_attraction and second_greatest_physical_memory_device_type_attraction are less than zero. A higher value (i.e., closer to zero) indicates higher gain. If a logic design memory can target only a single physical memory device type, the second gain value is set to MULTIPLIER. For example, if only a single physical memory device can be targeted, second_greatest_physical_memory_device_type_attraction equals negative infinity (i.e., smallest gain possible). If negative infinity is plugged into equation (4), no matter the value of greatest_physical_memory_device_type_attraction, the equation equals MULTIPLIER.

The first gain value and the second gain value associated with a particular compatible logic group may be added to create the overall gain of that compatible logic group. The logic design to hardware application compares the overall gains of each compatible logic group (i.e., those not yet mapped) to determine the next compatible logic group from which memory slices are to be mapped onto a physical memory device. These gain values used to prioritize compatible logic groups are merely illustrative. Any other suitable values, criteria, or techniques may be used to prioritize compatible logic groups.

From the highest priority compatible logic group, the logic design to hardware application selects the highest priority constraint sub-group (e.g., based on step 608) the memory slices of which have not yet been mapped. From the highest priority constraint sub-group, the logic design to hardware application selects the highest priority clique (e.g., based on step 606) the memory slices of which have not yet been mapped. The memory slices that make up the highest priority clique may be granted the highest priority to be mapped to a physical memory device.

At step 614, the logic design to hardware application may map the highest priority memory slices. The logic design to hardware application maps the memory slices to an available physical memory device of the type to which the corresponding logic group has the greatest attraction (e.g., as determined at step 612).

When the highest priority memory slices are mapped, the logic design to hardware application may, to the extent possible, fill the physical memory device to which the highest priority memory slice were mapped with other memory slices (i.e., in decreasing priority order) from the same compatible logic group. Constraints, such as fixed relative location constraints within a floating region, may prevent memory slices from being mapped together, thus limiting the ability to fill the physical memory device.

In one suitable approach, the logic design to hardware application may consider the criticality of connections, in terms of a timing analysis, coupled to memory slices. If a memory slice is coupled to critical connections, the logic design to hardware application may favor mapping these memory slices to more frequently occurring physical memory devices (i.e., to allow these memory slice to have a higher probability of getting closer to the logic to which they are coupled), to smaller physical memory devices (or to larger physical memory devices not filled to capacity) having fewer memory slices (i.e., such that there are fewer competing constraints to satisfy), and to faster physical memory devices (i.e., if the physical memory devices' operational speed is clock period limiting). The consideration of criticality of connection may be an optional feature of the logic design to hardware application. It will be apparent that the present invention may be practiced with or without this feature.

The logic design to hardware application may appropriately modify all incrementally updated information to reflect the mapping decisions. Mapping resumes at step 612 if at step 616 it is determined that there is space available in the physical memory devices and if at step 618 it is determined that not all memory slices have been mapped.

If the logic design to hardware application detects (i.e., at step 616) that the memory slices of a compatible logic group can not be fully mapped to the physical memory device locations available to it because those locations are occupied by memory slices of another compatible logic group, merged packing may be considered at step 622. In merged packing, the logic design to hardware application may map memory slices from more than one compatible logic group into a single physical memory device having two or more ports.

Figure 10:
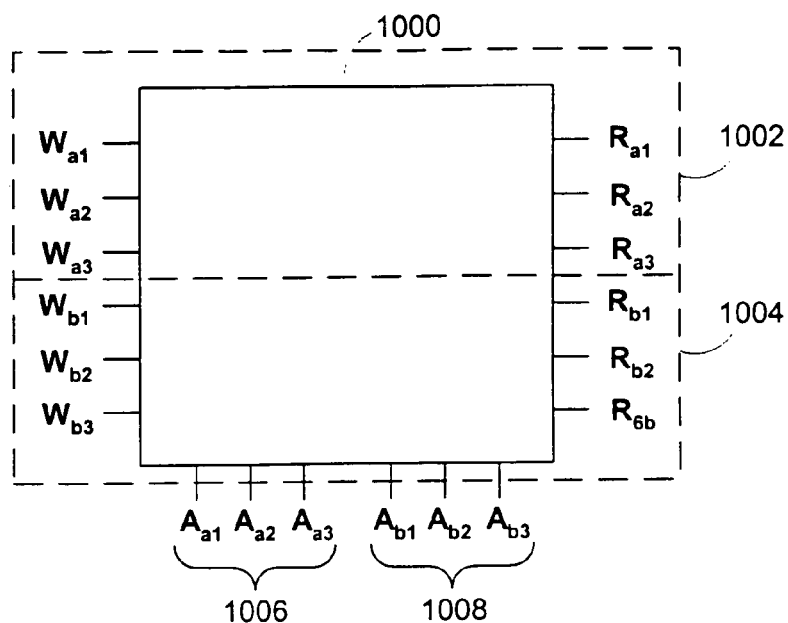
FIG. 10 is a schematic diagram of an illustrative two-port physical memory device.
Figure 11:
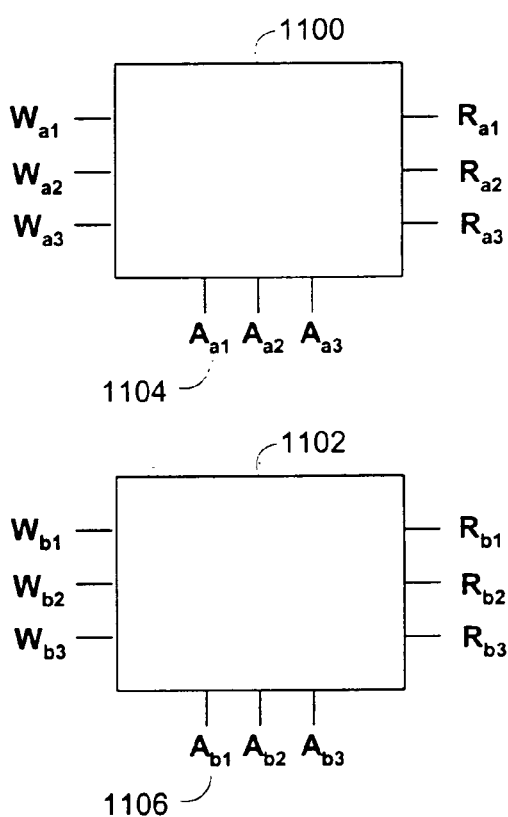
FIG. 11 is a schematic diagram of two illustrative single-port logic design memory that may be implemented in the two-part physical memory device of FIG. 10 in accordance with one embodiment of the present invention.

For example, the logic design to hardware application may map memory slices in two compatible logic groups (e.g., from two incompatible single-port logic design memory elements of sufficiently narrow depth) to a two-port physical memory device. FIG. 10 is a schematic diagram of an illustrative two-port physical memory device 1000. Physical memory device 1000 includes independent ports 1002 and 1004, with respective address pins 1006 and 1008. The logic design to hardware application may effectively separate ports 1002 and 1004 into physical memory devices 1100 and 1102, respectively, of FIG. 11. This may be accomplished by, for example, tying off an address bit on each of the ports to opposite bit values so the two ports access independent parts of the memory space (e.g., setting pin 1104 to low and pin 1106 to high). This mapping technique is referred to as merged packing because memory slices from two independent compatible logic groups may be merged in a single physical memory device.

Figure 12:
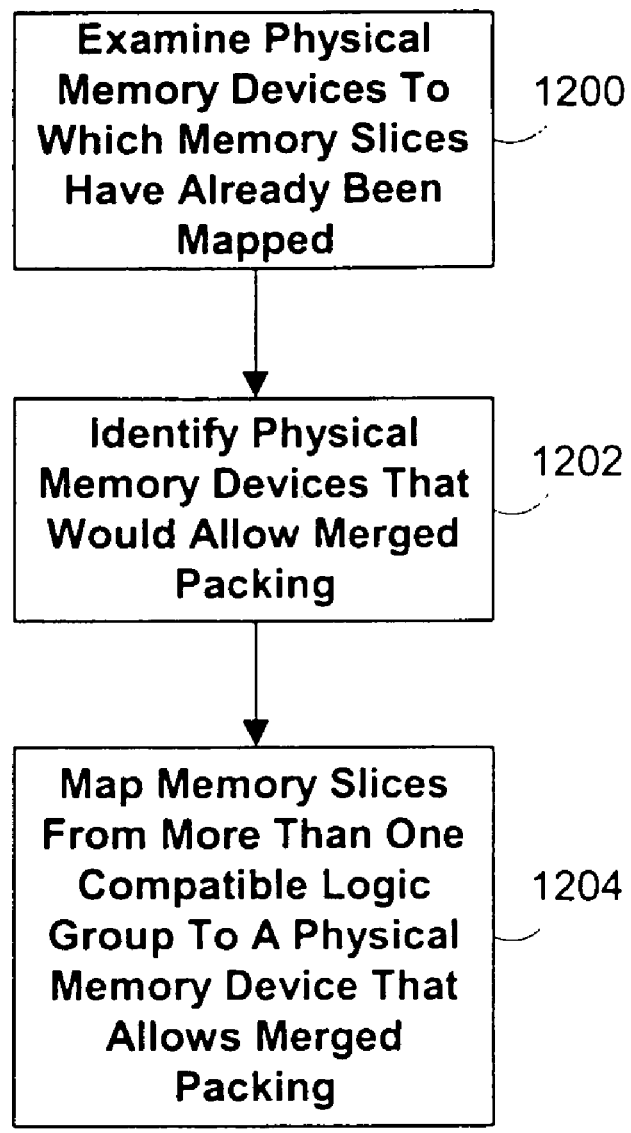
FIG. 12 is a flow-chart of illustrative steps involved in performing merged packing in accordance with one embodiment of the present invention.

If decided upon, merged packing occurs at step 624 (FIG. 6). FIG. 12 is a flow-chart of illustrative steps involved in performing merged packing in accordance with one embodiment of the present invention. To perform this type of mapping, the logic design to hardware application examines physical memory devices to which memory slices have already been mapped at step 1200. Physical memory devices that permit this type of merged packing are identified at step 1202. For example, one set of criteria that may be used in identifying physical memory devices that are capable of merged packing includes checking whether a physical memory device has mapped to it memory slices from a single-port logic design memory, and whether the physical memory device has a dual-port mode that offers address depths large enough to accommodate the memory slices from two single-port logic design memory in independent memory spaces. If a physical memory device candidate for merged packing is found, then at step 1204, the logic design to hardware application may map the highest priority memory slices from the compatible logic group that does not have enough physical space available for all its memory slices to one of the physical memory devices identified at step 1202. Because the amount of space available affects priority, mapping the highest priority memory slices first may reduce the shortage in the amount of physical space available. Other memory slices in the compatible logic group (i.e., in decreasing priority order) may be used to fill the physical memory device as much as possible.

In one suitable approach, the logic design to hardware application may use merged packing as a substantially last resort to alleviate space problems. This may be the case because mapping memory slices from two independent compatible logic groups together is often inefficient from an optimization perspective. Independent memory is often coupled to independent logic, but merged packing forces the independent memory to move together, preventing them from both "getting close" to the logic to which they are coupled.

In another suitable approach, the logic design to hardware application may employ merged packing in ways other than to solve space problems. For example, merged packing may be performed based on user settings, constraints, or both (e.g., the user may indicate that certain logic design memory is to be implemented using merged packing into a certain physical memory device). Any such suitable use of merged packing may be used.

It will be understood that the logic design to hardware application may also employ a merged packing technique with respect to relatively large single-port physical memory devices. It will be further understood that merged packing may be used to implement $N_i$ port logic design memory elements into a K port physical memory device if $N_1+N_2<=K$ (i.e., provided each is of sufficiently narrow depth). For example, a two-port, three-port, and five-port logic design memory elements may fit into a ten-port physical memory device if the address bits are tied off appropriately such that each independent logic design memory element is implemented in independent physical memory (i.e., that may be accessed independently of each other).

Referring back to FIG. 6, if the logic design to hardware application detects, at step 622, that a compatible logic group can not be fully mapped to the physical memory device locations available and that merged packing can not be performed to alleviate the problem, then the mapping iteration has failed. If, at step 626, the logic design to hardware application determines that not too many iterations failed (e.g., a predetermined number of failures) using for example a value such as that maintained in the num_times_sub_group_mapping_failed variable of equations (1) and (2) above, then at step 628, the logic design to hardware application may record information as to the cause of the failure. For example, the logic design to hardware application may record the identity of the highest priority constraint sub-group within the compatible logical group that could not be mapped, any other suitable information, or any combination thereof.

In another suitable approach, the logic design to hardware application may continue to map logic design memory after an initial failure is encountered. In this way, the logic design to hardware application may identify other constraint sub-groups that are difficult to map to physical memory devices. This information may be used to allow a feasible mapping solution to be obtained in fewer iterations.

The logic design to hardware application may then, also at step 628, unmap all memory slices that are not constrained to a single physical memory device location. Flow may be returned to step 608 where the logic design to hardware application sorts, once again, the constraint sub-groups of the compatible logic group that failed mapping. The re-sorting causes the constraint sub-groups to be reprioritized (i.e., based on the metric used for sorting, discussed above with respect to step 608). The constraint sub-group that failed mapping should now have an elevated priority. Mapping then resumes once more at step 610 as previously discussed, this time with the new constraint sub-group prioritization.

If, at step 626, the logic design to hardware application determines that there have been too many failures, the logic design to hardware application may, at step 628, use the data regarding failures that had been previously collected to inform the user which logic design memory it had trouble mapping and may make suggestions to the user about how to relax the user's constraints on that logic design memory at step 630.

The logic design to hardware application may distinguish, at step 630, between failures involving a single logic design memory (e.g., mapping of a particular logic design memory repeatedly failed because the user assigned a location constraint that does not include enough physical memory devices to accommodate the logic design memory), and failures involving multiple logic design memory elements (e.g., different logic design memory elements failed at different iterations because they were competing for an insufficient number of resources in a region on the programmable logic device).

If, at step 618, the logic design to hardware application determines that mapping has succeeded, the logic design to hardware application may perform simulated annealing on the solution to explore other possible solutions for optimization purposes. Simulated annealing is an optimization technique that accepts or rejects proposed modifications that alter the current solution based on a cost analysis. Each solution is assigned a cost. Modification refers to modification of the mapping solution generated in the initial feasibility-driven analysis. Thus, the logic design to hardware application modifies the mapping of memory slices with respect to the representation of the programmable logic device it stores.

Simulated annealing begins at a high temperature (metaphorically), which is reduced over time (i.e., with each proposed modification). At higher temperatures, modifications that result in cost increases are accepted with higher probability relative to lower temperatures, although the higher the cost increase, the lower that probability becomes. At lower temperatures, modifications that result in cost increases may almost never be accepted and the annealing process becomes more greedy in the sense that it tends to accept only those modifications that result in cost decreases. Modifications that result in cost reductions are preferably accepted no matter what the temperature. Eventually, cost reductions stop or become negligible. The simulated annealing feature of the logic design to hardware application may detect this status and may as a result, exit the simulated annealing process.

For each compatible logical group, the logic design to hardware application may use simulated annealing to explore different assignments of memory slices to physical memory devices that may be used to implement the compatible logic group. It will be understood that the greedy mapping described above makes no attempt to optimize the mapping of memory slices to physical memory devices (e.g., by determining which memory slices should be grouped together). Rather, the effort is focused on finding a feasible solution. The simulated annealing phase may be used for finding an optimized mapping of memory slices to physical memory devices in terms of space and resource usage, optimization of timing constraints, power demand, any other suitable optimization, or any combination thereof.

In one suitable approach, the logic design to hardware application may constantly maintain feasibility by, for example, moving memory slices only between those physical memory devices to which compatible logic groups have already been mapped. In another suitable approach, the logic design to hardware application may allow the simulated annealing to process to make moves that result in a non-feasible solution (e.g., by not satisfying one or more constraints). These non-feasible moves may be tolerable assuming, for example, that the logic design to hardware application ensures that such illegalities will be resolved in later moves.

To monitor the quality of the current memory slice configuration during any point in the simulated annealing process, the logic design to hardware application may compute a total cost for each mapping solution. The logic design to hardware application may use any suitable criteria, parameters, or both for computing a cost.

In one suitable approach, the logic design to hardware application may compute a sub-cost associated with having particular memory slices mapped to each physical memory device. That is, a sub-cost may be computed for each physical memory device. The sum of all of the sub-costs for all (or, alternatively, only the relevant) physical memory devices produces the total cost for a particular mapping solution.

The logic design to hardware application may compute sub-costs based on any suitable criteria, parameters, or both. For example, one component of the sub-cost may be the number of distinct non-memory elements coupled to memory slices to be implemented in a physical memory device. Before logic design memory mapping takes place, logic element mapping and mapping of other types of logic blocks may have taken place. By examining the number of distinct non-memory elements (e.g., logic blocks) to which memory slices are connected (i.e., via the physical memory devices in which they are implemented), related memory slices may be encouraged to be mapped together in a single or neighboring physical memory device.

Another component of the sub-cost may be, for example, the following value:

$$\text{fabs}((\text{num\_memory\_slices\_in\_physical\_memory\_device}/ \text{num\_memory\_slices\_physical\_memory\_device\_can\_accomodate}) - \text{target\_percentage\_utilization}) \quad (6)$$

The target_percentage_utilization is the percentage utilization of all physical memory devices that implement a compatible logic group. During simulated annealing, the logic design to hardware application may attempt to optimize the mapping solution by accepting moves that result in a similar percentage utilization for each physical memory device.

Another component of the sub-cost may be, for example, the following value:

$$-(\text{num\_memory\_slices\_in\_floating\_regions}^2 + \text{num\_memory\_slices\_not\_in\_floating\_regions}^2) \quad (7)$$

This component encourages maximizing the number of floating region memory slices or non-floating region memory slices in a physical memory device. The imbalance consolidates memory slices in a floating region together leading to smaller sized floating regions. Thus, it is better to put all non-floating regions into one physical memory device or all floating regions into one physical memory device.

Another component of the sub-cost may be, for example, the value:

$$-(\text{num\_memory\_slices\_connections\_captured}) \quad (8)$$

This value is representative of the number of connections through which memory slices in the physical memory device drive memory slices in the same device. The logic design to hardware application may prefer to increase captured connections using simulated annealing. For example, if more memory slices within a physical memory device feed other memory slices within the same physical memory device, it may be advantageous because related memory slices are being captured in a local region.

The logic design to hardware application may multiply each of the sub-cost components, such as those discussed above, by a sub-cost multiplier (i.e., for normalization) and then add the products together to determine the total cost of the physical memory device and, in turn, the total cost of the current mapping solution (i.e., by adding the individual physical memory device costs).

When evaluating the effect of each move during the simulated annealing process and when completing a move, all of the costs may be incrementally updated to save time. That is, only the sub-costs that are being affected are changed (e.g., those sub-costs associated with physical memory devices in which memory slices are being moved). The total cost may be modified using the resulting changes in sub-costs. This may be accomplished by, for example, retaining extra data to detect the types of changes and effects of changes being made with each move.

A move in the simulated annealing process may involve selecting a primary memory slice and a physical memory device in which to move the primary memory slice. The logic design to hardware application may select moves on a random basis. Alternatively, the moves may be selected based on predetermined factors, dynamically determined factors, or both.

Because the logic design to hardware application supports memory slices of different sizes, one or more memory slices may have to be selected at the target physical memory device location to swap into the source physical memory device location (or into any other suitable physical memory device location) to make room at the target physical memory device location. In turn, more memory slices (e.g., from the source physical memory device location or from any other suitable physical memory device location) may need to be selected for swapping together with the primary memory slice. This, again, may cause one or more additional memory slice to be selected for swapping from the target physical memory device location. This back and forth selection of memory slices to be swapped may continue until a set of memory slices are selected for swapping that constitute a feasible move or the move is considered impossible because further additions to the memory slices that are being swapped is impossible or because, for example, illegal memory slice groupings would be created. The logic design to hardware application maintains the validity of the current mapping solution by rejecting a move that will create an illegal mapping (i.e., unless, for example, the logic design is configured to accept illegal moves but to remove the illegality with one or more subsequent moves). In one suitable approach, the logic design to hardware application may attempt to minimize secondary moves needed to accommodate a particular primary move.

If merged packing is used, the logic design to hardware application may make sure to move only the memory slices implemented in the physical memory device that correspond to a single compatible logic group during the simulated annealing process. The other memory slices, corresponding to one or more other compatible logic groups may be treated independently with respect to each other and with respect to the first compatible logic group memory slices.

Figure 13:
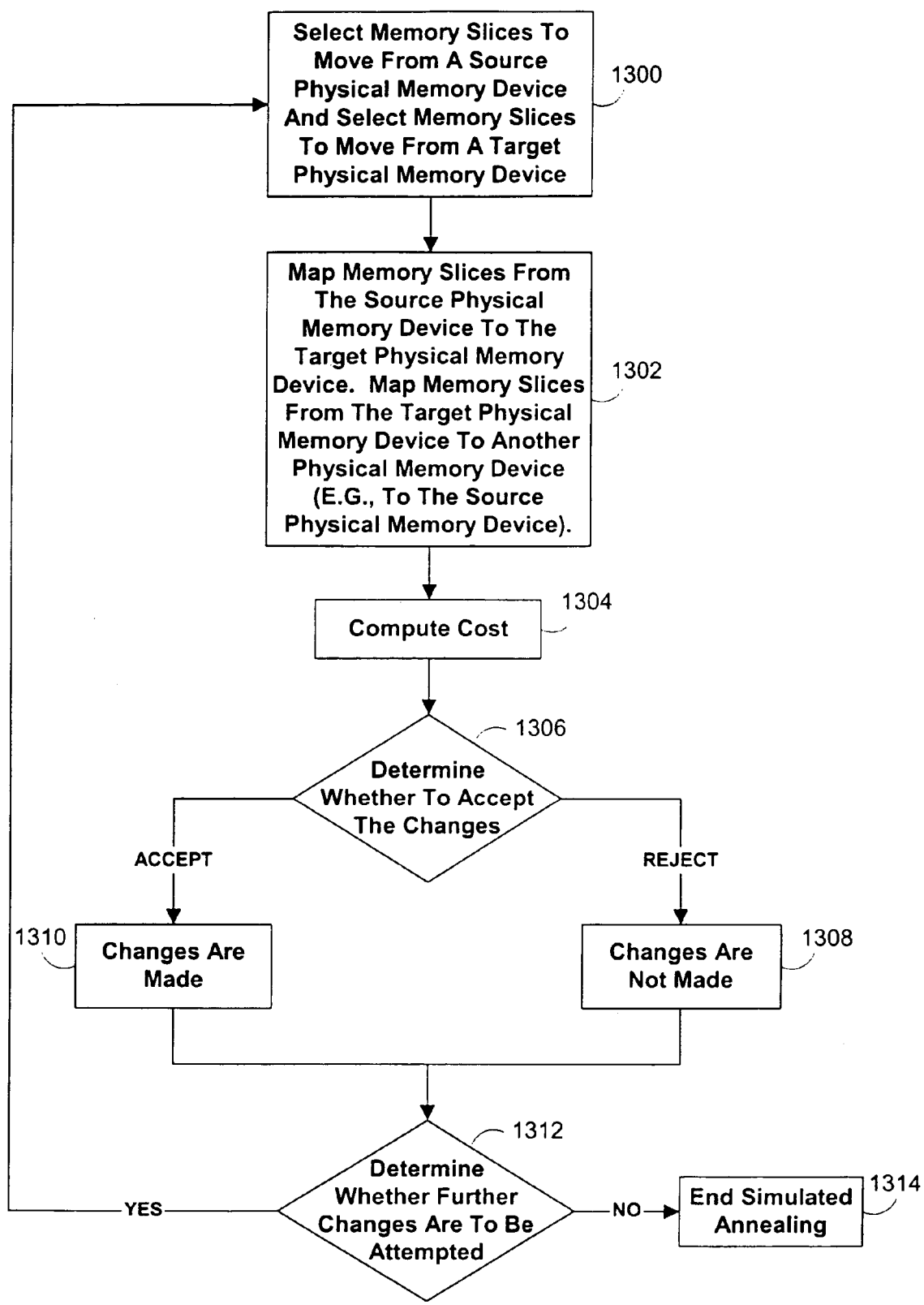
FIG. 13 is a flow-chart of illustrative steps involved in using simulated annealing to optimize the mapping of logic design memory to physical memory devices in accordance with one embodiment of the present invention.

FIG. 13 is a flow-chart of illustrative steps involved in using simulated annealing to optimize the mapping of logic design memory to physical memory devices in accordance with one embodiment of the present invention. At step 1300, the logic design to hardware application selects memory slices from a particular source physical memory device that are to be moved to a target physical memory device. Also memory slices at the target physical memory are selected to be moved in order to make room for the memory slices from the source physical memory device (i.e., possibly causing other memory slices of other physical memory devices to be moved to accommodate the uprooted memory slices). These changes may be selected in accordance with any constraints in effect.

At step 1302, the logic design to hardware application makes the changes in the mappings of memory slices to physical memory devices as determined at step 1300.

At step 1304, the logic design to hardware application computes the cost of the modified mapping solution. Any suitable criteria, parameters, or both may be used in computing the cost, including, for example and without limitation, those components discussed above.

At step 1306, the logic design to hardware application determines whether the changes made are acceptable. This determination may be based at least in part on the computed cost and the stage of the simulated annealing in which the proposed changes were made. If accepted, the changes are made permanent (i.e., subject to further changes) at step 1310. Otherwise, if the changes are not accepted, then the changes are undone and the mapping solution remains unchanged at step 1308.

At step 1312, the logic design to hardware application determines whether further changes are to be attempted. Because the simulated annealing is performed with the goal of reducing cost (i.e., to optimize the resultant circuit), the logic design to hardware application may decide to end the simulated annealing at step 1314 if it determines that the cost reductions have become non-existent or negligible (e.g., based on a particular number of previous consecutive changes). If the logic design to hardware application determines that such a state has not yet been reached, then the simulated annealing process may continue at step 1300 with another prospective change in memory slice mapping.

After simulated annealing of all compatible logic groups is completed, the logic design to hardware application may use the mapping information to construct a clustered netlist that includes physical memory blocks instead of individual memory slices. The clustered netlist may be used by placer and router software, hardware, or both to implement the final physical circuit in the programmable logic device.

Figure 14:
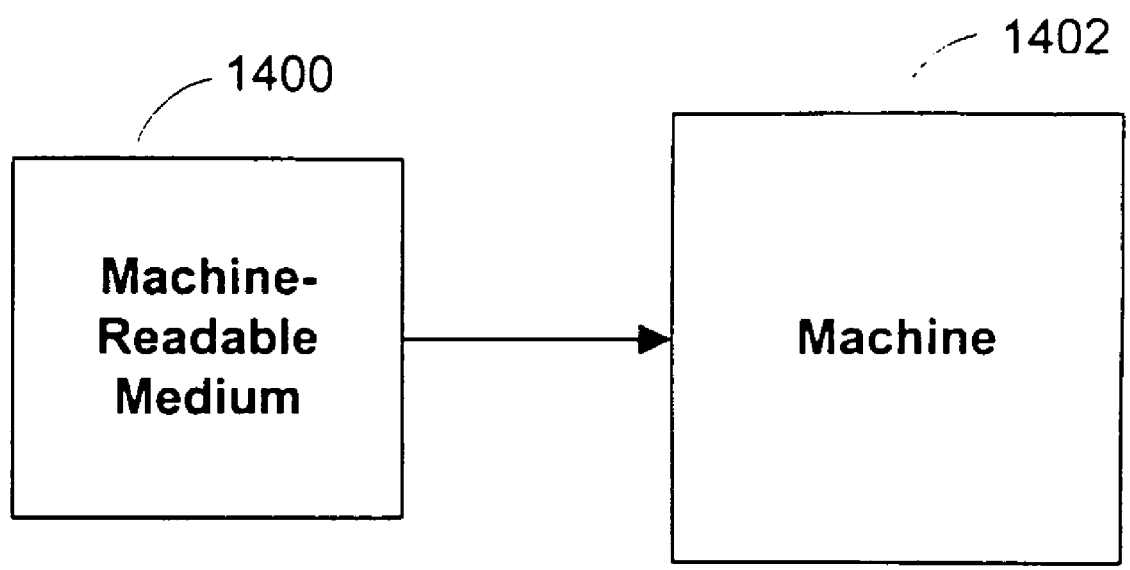
FIG. 14 is a schematic diagram of an illustrative machine-readable medium that may be encoded with machine-readable instructions for use in implementing a user logic design in a programmable logic device.

FIG. 14 is a schematic diagram of an illustrative machine-readable medium that may be encoded with machine-readable instructions for use in implementing a user logic design in a programmable logic device. Machine-readable medium 1400 may be encoded with instructions for carrying out the features described herein with respect to the logic design to hardware application. Machine-readable medium 1400 may be, for example, magnetic disks (e.g., floppy disks, hard disk drives), optical disks (e.g., CD-ROM/R/RW, DVD −R/−RW/+R/+RW/RAM/ROM), EPROM, FLASH memory, a programmable logic device, an ASIC device, any other suitable medium, or any combination thereof. Machine 1402 may be any suitable machine capable of reading machine-readable medium 1400, such as any suitable computer.

Thus, methods mapping logic design memory in physical memory devices are provided. One skilled in the art will appreciate that the present invention can be practiced by other than the described embodiments, which are presented for purposes of illustration and not of limitation, and the present invention is limited only by the claims which follow.

What is claimed is:

1. A method for implementing a user logic design including at least one logic design memory in a programmable logic device comprising physical memory devices of one or more types, the method comprising:
   dividing the logic design memory into a plurality of memory slices;
   grouping the plurality of memory slices into one or more compatible logic groups, wherein memory slices of a particular compatible logic group have substantially the same control signals;
   performing an analysis of the programmable logic device including determining number and types of the physical memory devices available on the programmable logic device; and
   mapping the plurality of memory slices onto the physical memory devices based on the analysis and in an order determined by to which compatible logic group each of the plurality of memory slices belongs.

2. The method of claim 1 wherein the dividing the logic design memory into a plurality of memory slices comprises dividing the logic design memory into a plurality of minimum-width memory slices.

3. The method of claim 1 wherein the dividing the logic design memory into a plurality of memory slices comprises dividing the logic design memory into a plurality of memory slices comprising at least one memory slice of a different size from the remaining memory slices.

4. The method of claim 1 wherein the dividing the logic design memory into a plurality of memory slices comprises dividing the logic design memory into a plurality of memory slices of the same size.

5. The method of claim 1 wherein the mapping the plurality of memory slices to the physical memory devices further comprises mapping each memory slice of the plurality of memory slices to a type of physical memory device to which the memory slice is most attracted.

6. The method of claim 1 wherein the performing an analysis of the programmable logic device including the physical memory devices comprises identifying constraints.

7. The method of claim 1 wherein the mapping the plurality of memory slice to the physical memory device produces a first solution, the method further comprising optimizing the first solution to produce a second solution.

8. The method of claim 7 further comprising ensuring that the second solution satisfies all constraints.

9. The method of claim 7 wherein the optimizing the first solution to produce a second solution comprises using simulated annealing to optimize the first solution to produce the second solution.

10. The method of claim 1 wherein the mapping the plurality of memory slices to the physical memory devices further comprises:
grouping memory slices within each of the one or more compatible logic group into one or more sub-groups, wherein memory slices grouped into a particular sub-group share substantially the same constraints; and
mapping the plurality of memory slices onto the physical memory devices in an order determined by to which compatible logic group and sub-group each of the plurality of memory slices belongs, the method further comprising:
grouping the memory slices within the one or more sub-groups into one or more cliques, wherein memory slices grouped into a particular clique are constrained to be implemented in the same physical memory device.

11. The method of claim 10 wherein:
grouping memory slices within each of the one or more compatible logic group into one or more sub-groups comprises sorting the one or more sub-groups into a sub-group prioritization order;
grouping the memory slices within the one or more sub-groups into one or more cliques comprises sorting the one or more cliques into a clique prioritization order; and
mapping the plurality of memory slices onto the physical memory devices in an order determined by to which compatible logic group and sub-group each of the plurality of memory slices belongs comprises mapping the plurality of memory slices onto the physical memory devices in an order determined by to which compatible logic group each of the plurality of memory slices belongs and according to the sub-group prioritization order and the clique prioritization.

12. The method of claim 11 wherein the sorting the one or more cliques into a clique prioritization order comprises sorting the one or more cliques into a clique prioritization order based on sizes of the one or more cliques.

13. The method of claim 11 wherein the sorting the one or more sub-groups into a sub-group prioritization order comprises determining a metric for each of the one or more sub-groups based on values selected from the group consisting of how many times a largest clique from each of the one or more sub-groups can be theoretically mapped onto the physical memory devices, how many cliques of a largest size are in each of the one or more sub-groups, a number of times that mapping failed for each of the one or more sub-groups, and any combination thereof.

14. The method of claim 11 wherein the mapping the plurality of memory slices onto the physical memory devices in an order determined by to which compatible logic group each of the plurality of memory slices belongs comprises determining a highest priority compatible logic group based at least in part on information about sub-groups from each of the one or more compatible logic groups.

15. The method of claim 11 wherein the mapping the plurality of memory slices onto the physical memory devices in an order determined by to which compatible logic group each of the plurality of memory slices belongs comprises determining a highest priority compatible logic group based at least in part on information regarding attraction of memory slices of each of the one or more compatible logic groups to types of available physical memory devices.

16. The method of claim 10 wherein the mapping the plurality of memory slices onto the physical memory devices in an order determined by to which compatible logic group and sub-group each of the plurality of memory slices belongs comprises mapping the plurality of memory slices of a highest priority sub-group of a highest priority compatible logic group onto the physical memory devices, the method further comprising:
determining whether the mapping failed for the highest priority sub-group into a first physical memory device;
recording information regarding a cause of failure;
sorting the one or more sub-groups of each of the one or more compatible logic groups based at least in part on the information regarding the cause of failure;
determining a next highest priority compatible logic group based at least in part on the information regarding the cause of failure;
identifying a second physical memory device in which to map memory slices of a next highest priority sub-group from the next highest priority compatible logic group; and
mapping memory slices from the next highest priority sub-group of the next highest priority compatible logic group onto one of the physical memory devices.

17. The method of claim 1 wherein the mapping the plurality of memory slices onto the physical memory devices comprises mapping the plurality of memory slices onto the physical memory devices in a representation of the programmable logic device, the method further comprising implementing the plurality of memory slices in the programmable logic device based on the representation of the programmable logic device.

18. The method of claim 1 wherein the mapping the plurality of memory slices to the physical memory devices comprises mapping memory slices of more than one compatible logic group to a single physical memory device.

19. The method of claim 1 wherein the memory slices comprise at least one memory slice that differs in size from the remaining memory slices.

20. The method of claim 1 further comprising implementing the memory slices in the physical memory devices.

21. A method for implementing a user logic design including at least one logic design memory in a programmable logic device comprising physical memory devices, the method comprising:
dividing the logic design memory into a plurality of memory slices, wherein the memory slices comprise at least one memory slice that differs in size from the remaining memory slices; and
grouping the plurality of memory slices into one or more compatible logic groups, wherein memory slices of a particular compatible logic group have substantially the same control signals;

mapping the plurality of memory slices onto the physical memory devices in an order determined by to which compatible logic group each of the plurality of memory slices belongs; and
implementing the plurality of memory slices in the physical memory devices.

22. The method of claim 21 wherein the dividing the logic design memory into a plurality of memory slices comprises dividing the logic design memory into a plurality of minimum-width memory slices.

23. The method of claim 21 wherein the implementing the plurality of memory slices in the physical memory devices comprises:
performing an analysis of the programmable logic device including determining number and types of the physical memory devices available on the programmable logic device; and
mapping the plurality of memory slices onto the physical memory devices based on the analysis.

24. The method of claim 21 wherein the mapping the plurality of memory slices to the physical memory devices further comprises mapping each memory slice of the plurality of memory slices to a type of physical memory device to which the memory slice is most attracted.

25. The method of claim 23 wherein the performing an analysis of the programmable logic device including the physical memory devices comprises identifying constraints.

26. The method of claim 23 wherein the mapping the plurality of memory slice to the physical memory device produces a first solution, the method further comprising optimizing the first solution to produce a second solution.

27. The method of claim 26 further comprising ensuring that the second solution satisfies all constraints.

28. The method of claim 26 wherein the optimizing the first solution to produce a second solution comprises using simulated annealing to optimize the first solution to produce the second solution.

29. The method of claim 23 wherein the mapping the plurality of memory slices to the physical memory devices further comprises:
grouping memory slices within each of the one or more compatible logic group into one or more sub-groups, wherein memory slices grouped into a particular sub-group share substantially the same constraints; and
mapping the plurality of memory slices onto the physical memory devices in an order determined by to which compatible logic group and sub-group each of the plurality of memory slices belongs; the method further comprising:
grouping the memory slices within the one or more sub-groups into one or more cliques, wherein memory slices grouped into a particular clique are constrained to be implemented in the same physical memory device.

30. The method of claim 29 wherein:
grouping memory slices within each of the one or more compatible logic group into one or more sub-groups comprises sorting the one or more sub-groups into a sub-group prioritization order;
grouping the memory slices within the one or more sub-groups into one or more cliques comprises sorting the one or more cliques into a clique prioritization order; and
mapping the plurality of memory slices onto the physical memory devices in an order determined by to which compatible logic group and sub-group each of the plurality of memory slices belongs comprises mapping the plurality of memory slices onto the physical memory devices in an order determined by to which compatible logic group each of the plurality of memory slices belongs and according to the sub-group prioritization order and the clique prioritization.

31. The method of claim 30 wherein the sorting the one or more cliques into a clique prioritization order comprises sorting the one or more cliques into a clique prioritization order based on sizes of the one or more cliques.

32. The method of claim 30 wherein the sorting the one or more sub-groups into a sub-group prioritization order comprises determining a metric for each of the one or more sub-groups based on values selected from the group consisting of how many times a largest clique from each of the one or more sub-groups can be theoretically mapped onto the physical memory devices, how many cliques of a largest size are in each of the one or more sub-groups, a number of times that mapping failed for each of the one or more sub-groups, and any combination thereof.

33. The method of claim 30 wherein the mapping the plurality of memory slices onto the physical memory devices in an order determined by to which compatible logic group each of the plurality of memory slices belongs comprises determining a highest priority compatible logic group based at least in part on information about sub-groups from each of the one or more compatible logic groups.

34. The method of claim 30 wherein the mapping the plurality of memory slices onto the physical memory devices in an order determined by to which compatible logic group each of the plurality of memory slices belongs comprises determining a highest priority compatible logic group based at least in part on information regarding attraction of memory slices of each of the one or more compatible logic groups to types of available physical memory devices.

35. The method of claim 29 wherein the mapping the plurality of memory slices onto the physical memory devices in an order determined by to which compatible logic group and sub-group each of the plurality of memory slices belongs comprises mapping the plurality of memory slices of a highest priority sub-group of a highest priority compatible logic group onto the physical memory devices, the method further comprising:
determining whether the mapping failed for the highest priority sub-group into a first physical memory device;
recording information regarding a cause of failure;
sorting the one or more sub-groups of each of the one or more compatible logic groups based at least in part on the information regarding the cause of failure;
determining a next highest priority compatible logic group based at least in part on the information regarding the cause of failure;
identifying a second physical memory device in which to map memory slices of a next highest priority sub-group from the next highest priority compatible logic group; and
mapping memory slices from the next highest priority sub-group of the next highest priority compatible logic group onto one of the physical memory devices.

36. The method of claim 23 wherein the mapping the plurality of memory slices onto the physical memory devices comprises mapping the plurality of memory slices onto the physical memory devices in a representation of the programmable logic device, the method further comprising implementing the plurality of memory slices in the programmable logic device based on the representation of the programmable logic device.

37. The method of claim 23 wherein the mapping the plurality of memory slices to the physical memory devices comprises mapping memory slices of more than one compatible logic group to a single physical memory device.

38. A method for implementing a user logic design including at least one logic design memory in a programmable logic device comprising physical memory devices, the method comprising:
   dividing the logic design memory into a plurality of memory slices;
   grouping the plurality of memory slices into one or more compatible logic groups, wherein memory slices of a particular compatible logic group have substantially the same control signals; and
   mapping each of the memory slices to one or more of the physical memory devices, wherein the mapping satisfies logic design memory constraints and is in an order determined by to which compatible logic group each of the plurality of memory slices belongs.

39. The method of claim 38 wherein the dividing the logic design memory into a plurality of memory slices comprises dividing the logic design memory into a plurality of minimum-width memory slices.

40. The method of claim 38 wherein the dividing the logic design memory into a plurality of memory slices comprises dividing the logic design memory into a plurality of memory slices comprising at least one memory slice of a different size from the remaining memory slices.

41. The method of claim 38 wherein the dividing the logic design memory into a plurality of memory slices comprises dividing the logic design memory into a plurality of memory slices of the same size.

42. The method of claim 38 further comprising:
   performing an analysis of the programmable logic device including determining number and types of the physical memory devices available on the programmable logic device; and
   mapping the plurality of memory slices to the physical memory devices based on the analysis.

43. The method of claim 42 wherein the mapping the plurality of memory slices to the physical memory devices further comprises mapping each memory slice of the plurality of memory slices to a type of physical memory device to which the memory slice is most attracted.

44. The method of claim 42 wherein the performing an analysis of the programmable logic device including the physical memory devices comprises identifying constraints.

45. The method of claim 38 wherein the mapping the plurality of memory slice to the physical memory device produces a first solution, the method further comprising optimizing the first solution to produce a second solution.

46. The method of claim 45 further comprising ensuring that the second solution satisfies all constraints.

47. The method of claim 45 wherein the optimizing the first solution to produce a second solution comprises using simulated annealing to optimize the first solution to produce the second solution.

48. The method of claim 38 wherein the mapping the plurality of memory slices to the physical memory devices comprises:
   grouping memory slices within each of the one or more compatible logic group into one or more sub-groups, wherein memory slices grouped into a particular sub-group share substantially the same constraints; and
   mapping the plurality of memory slices onto the physical memory devices in an order determined by to which compatible logic group and sub-group each of the plurality of memory slices belongs, the method further comprising:
      grouping the memory slices within the one or more sub-groups into one or more cliques, wherein memory slices grouped into a particular clique are constrained to be implemented in the same physical memory device.

49. The method of claim 48 wherein:
   grouping memory slices within each of the one or more compatible logic group into one or more sub-groups comprises sorting the one or more sub-groups into a sub-group prioritization order;
   grouping the memory slices within the one or more sub-groups into one or more cliques comprises sorting the one or more cliques into a clique prioritization order; and
   mapping the plurality of memory slices onto the physical memory devices in an order determined by to which compatible logic group and sub-group each of the plurality of memory slices belongs comprises mapping the plurality of memory slices onto the physical memory devices in an order determined by to which compatible logic group each of the plurality of memory slices belongs and according to the sub-group prioritization order and the clique prioritization.

50. The method of claim 49 wherein the sorting the one or more cliques into a clique prioritization order comprises sorting the one or more cliques into a clique prioritization order based on sizes of the one or more cliques.

51. The method of claim 49 wherein the sorting the one or more sub-groups into a sub-group prioritization order comprises determining a metric for each of the one or more sub-groups based on values selected from the group consisting of how many times a largest clique from each of the one or more sub-groups can be theoretically mapped onto the physical memory devices, how many cliques of a largest size are in each of the one or more sub-groups, a number of times that mapping failed for each of the one or more sub-groups, and any combination thereof.

52. The method of claim 49 wherein the mapping the plurality of memory slices onto the physical memory devices in an order determined by to which compatible logic group each of the plurality of memory slices belongs comprises determining a highest priority compatible logic group based at least in part on information about sub-groups from each of the one or more compatible logic groups.

53. The method of claim 49 wherein the mapping the plurality of memory slices onto the physical memory devices in an order determined by to which compatible logic group each of the plurality of memory slices belongs comprises determining a highest priority compatible logic group based at least in part on information regarding attraction of memory slices of each of the one or more compatible logic groups to types of available physical memory devices.

54. The method of claim 48 wherein the mapping the plurality of memory slices onto the physical memory devices in an order determined by to which compatible logic group and sub-group each of the plurality of memory slices belongs comprises mapping the plurality of memory slices of a highest priority sub-group of a highest priority compatible logic group onto the physical memory devices, the method further comprising:
   determining whether the mapping failed for the highest priority sub-group into a first physical memory device;
   recording information regarding a cause of failure;
   sorting the one or more sub-groups of each of the one or more compatible logic groups based at least in part on the information regarding the cause of failure;

determining a next highest priority compatible logic group based at least in part on the information regarding the cause of failure;

identifying a second physical memory device in which to map memory slices of a next highest priority sub-group from the next highest priority compatible logic group; and mapping memory slices from the next highest priority sub-group of the next highest priority compatible logic group onto one of the physical memory devices.

55. The method of claim 38 wherein the mapping the plurality of memory slices onto the physical memory devices comprises mapping the plurality of memory slices onto the physical memory devices in a representation of the programmable logic device, the method further comprising implementing the plurality of memory slices in the programmable logic device based on the representation of the programmable logic device.

56. The method of claim 38 wherein the mapping the plurality of memory slices to the physical memory devices comprises mapping memory slices of more than one compatible logic group to a single physical memory device.

57. The method of claim 38 wherein the memory slices comprise at least one memory slice that differs in size from the remaining memory slices.

58. The method of claim 38 further comprising implementing the memory slices in the physical memory devices.

59. A machine-readable medium encoded with machine-readable instructions for use in implementing a user logic design including at least one logic design memory in a programmable logic device comprising physical memory devices of one or more types, the machine-readable instructions comprising:

dividing the logic design memory into a plurality of memory slices;

grouping the plurality of memory slices into one or more compatible logic groups, wherein memory slices of a particular compatible logic group have substantially the same control signals;

performing an analysis of the programmable logic device including determining number and types of the physical memory devices available on the programmable logic device; and mapping the plurality of memory slices onto the physical memory devices based on the analysis and in an order determined by to which compatible logic group each of the plurality of memory slices belongs.

60. A method for implementing a user logic design including at least one logic design memory in a programmable logic device comprising physical memory devices, the method comprising:

synthesizing logic blocks from the user logic design;

dividing the logic design memory into a plurality of memory slices;

grouping the plurality of memory slices into one or more compatible logic groups, wherein memory slices of a particular compatible logic group have substantially the same control signals; and mapping the plurality of memory slices onto the physical memory devices based on information about the logic blocks and the programmable logic device, including number and types of the physical memory devices available on the programmable logic device, and in an order determined by to which compatible logic group each of the plurality of memory slices belongs.

61. The method of claim 60 further comprising mapping the plurality of memory slices to the physical memory devices based at least in part on constraints.

62. The method of claim 60 further comprising mapping the plurality of memory slices to the physical memory devices based at least in part on user constraints.

63. The method of claim 60 further comprising mapping the plurality of memory slices to the physical memory devices based at least in part on location constraints.

64. The method of claim 60 further comprising mapping the plurality of memory slices to the physical memory devices based at least in part on previous optimizations.

65. The method of claim 60 wherein the logic blocks comprise multiplication and addition circuit elements.

66. The method of claim 60 wherein the logic blocks comprise logic elements.

* * * * *